(12) United States Patent
Slabaugh et al.

(10) Patent No.: US 8,068,653 B2
(45) Date of Patent: Nov. 29, 2011

(54) METHOD AND SYSTEM FOR SECOND BEND PLANE DETECTION OF EAR CANAL SURFACES

(75) Inventors: Gregory G. Slabaugh, London (GB); Tong Fang, Morganville, NJ (US); Rupen Melkisetoglu, Princeton, NJ (US); Simon Floery, Vienna (AT)

(73) Assignee: Siemens Audiologische Technik GmbH, Erlangen (DE)

( * ) Notice: Subject to any disclaimer, the term of this patent is extended or adjusted under 35 U.S.C. 154(b) by 629 days.

(21) Appl. No.: 12/313,600

(22) Filed: Nov. 21, 2008

(65) Prior Publication Data

US 2009/0148016 A1    Jun. 11, 2009

Related U.S. Application Data

(60) Provisional application No. 61/012,136, filed on Dec. 7, 2007.

(51) Int. Cl.
*G06K 9/00* (2006.01)
(52) U.S. Cl. ........................................ 382/128; 382/154
(58) Field of Classification Search ......................... None
See application file for complete search history.

(56) References Cited

U.S. PATENT DOCUMENTS

| 7,447,556 | B2 | 11/2008 | McBagonluri et al. | |
| 7,995,817 | B2* | 8/2011 | McBagonluri et al. | ....... 382/128 |
| 2007/0057941 | A1 | 3/2007 | Fang et al. | |
| 2007/0057942 | A1 | 3/2007 | Unal et al. | |
| 2007/0189564 | A1* | 8/2007 | McBagonluri et al. | ....... 381/322 |

FOREIGN PATENT DOCUMENTS

DE   10 2007 021 711 A1   11/2007
EP      1 345 470 A2   9/2003

OTHER PUBLICATIONS

Zouhar, a. et al., "Anatomically-Aware, Automatic, and Fast Registration of 3D Ear Impression Models", 3rd Int'l Symp. on 3D Data Process. Visual & Transmission, (3DPVT), 2006.

* cited by examiner

*Primary Examiner* — Minh N Tang

(57) ABSTRACT

A method and system for detecting the second bend plane of an ear canal surface is disclosed. A region of interest of the ear canal is defined between the first bend plane and the ear canal tip. A set of curves is defined in the region of interest and a set of high curvature points is detected from the set of curves. The second bend plane is detected using the set of high curvature points.

28 Claims, 5 Drawing Sheets

METHOD AND SYSTEM FOR SECOND BEND PLANE DETECTION OF EAR CANAL SURFACES

This application claims the benefit of U.S. Provisional Application No. 61/012,136, filed Dec. 7, 2007, the disclosure of which is herein incorporated by reference.

BACKGROUND OF THE INVENTION

The present invention generally relates to detection of anatomic features in 3D data representing an ear, and more particularly to detecting the second bend plane of the ear canal surface.

A current trend in hearing aid manufacturing is towards increased digitization and automation. Previously, hearing aids were designed in a laborious manual process that required a physical manipulation of shapes to produce a hearing aid customized to the geometry of a patient's ear canal. This hearing aid manufacturing process has been digitized, and many hearing aids are designed using computer aided design (CAD) software. Such software typically consists of a suite of surface processing tools, such as tools for cutting, rounding, tapering, and sculpting a digital representation of the ear surface.

In order to decrease the time required to manufacture a hearing aid, automation is required. One way to achieve automation of the hearing aid manufacturing is to automate the input to the processing tools of the CAD software. For example, instead of requiring a human software operator to place a plane for cutting on the ear surface, the plane can be placed automatically. The operator can then decide if the plane position is desirable, and adjust the plane position if necessary. Such automation has the potential to greatly improve efficiency of hearing aid manufacturing.

In order to automatically provide input to the surface processing tools, feature detection is required. Each ear canal surface has a different shape unique to an individual patient. Various anatomical features of ear canal surfaces exist that can be used to define the shape of an ear canal surface. Such features, when accurately detected, can be used as inputs for automatic hearing aid manufacturing. Accordingly, methods for automatically detecting such anatomic features of ear canal surfaces are desirable.

BRIEF SUMMARY OF THE INVENTION

Embodiments of the present invention provide automatic detection of the second bend plane of the ear canal. The second bend plane is a subtle planar feature of the ear canal surface characterized by a bend in the roughly cylindrical ear canal shape. The detected second bend plane can be used in automatic manufacturing of hearing aids.

In one embodiment of the present invention, a region of interest is defined for an ear canal surface by determining lower and upper boundary planes. A set of curves is defined in the region of interest running from the lower boundary plane to the upper boundary plane. A set of high curvature points is detected from the set of curves. The second bend plane is detected based on the set of high curvature points. The set of high curvature points can be pruned based on curvature. Candidate planes are detected from planes defined by combinations of three high curvature points. A neighborhood set of high curvature points is determined for each candidate plane, and the second bend plane is generated by fitting the second bend plane to the largest neighborhood set of high curvature points.

These and other advantages of the invention will be apparent to those of ordinary skill in the art by reference to the following detailed description and the accompanying drawings.

DETAILED DESCRIPTION OF EXEMPLARY EMBODIMENTS

The present invention relates to a method for detecting the second bend plane of an ear canal surface. Embodiments of the present invention are described herein to give a visual understanding of the second bend plane detection method. A digital image is often composed of digital representations of one or more objects (or shapes). The digital representation of an object is often described herein in terms of identifying and manipulating the objects. Such manipulations are virtual manipulations accomplished in the memory or other circuitry/hardware of a computer system. Accordingly, is to be understood that embodiments of the present invention may be performed within a computer system using data stored within the computer system. For example, according to various embodiments of the present invention, electronic data representing a 3D ear canal surface is manipulated within a computer system in order to detect a location of the second bend plane of the 3D ear canal surface.

The second bend plane of an ear canal surface is an important feature used for automatic hearing aid manufacturing. The ear canal has a roughly cylindrical shape with a first bend at the aperture and a second bend located between the aperture and the ear canal tip. The second bend plane is a plane located at the second bend between the first bend plane at the aperture and the canal tip. This feature can be challenging to accurately detect because it is a plane. While it may be fairly easy to identify areas of high curvature on the ear canal, the detection of a plane from this information is not trivial. Even using manual marking of the second bend plane, it can be difficult to exactly determine an accurate placement of the second bend plane.

Figure 1:
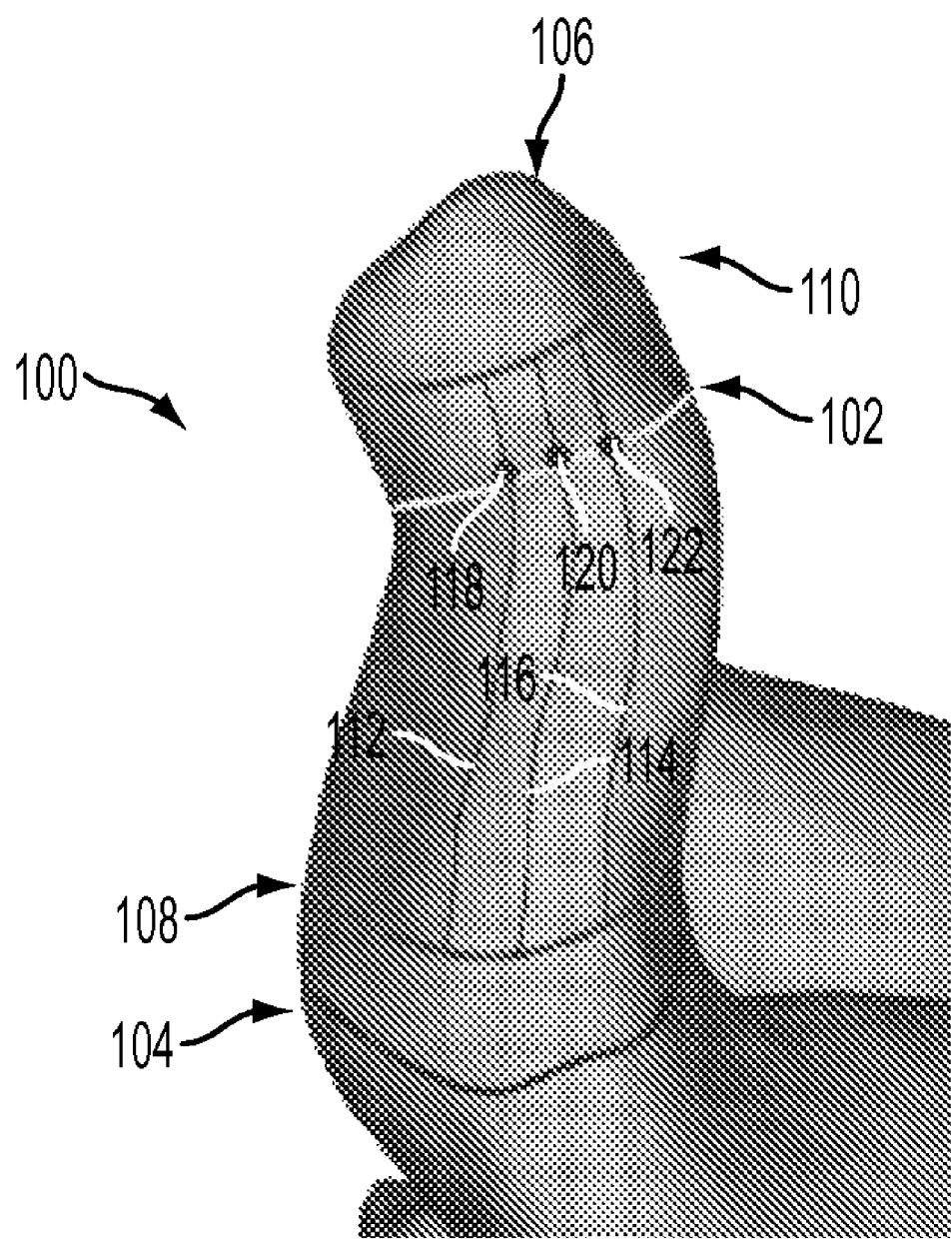
FIG. 1 illustrates an ear canal portion of a 3D undetailed ear impression.

FIG. 1 illustrates an ear canal portion of a 3D undetailed ear impression. As illustrated in FIG. 1, the second bend plane 102 is detected on the ear canal 100 between the first bend plane 104, which is located at the aperture, and the ear canal tip 106.

Figure 2:
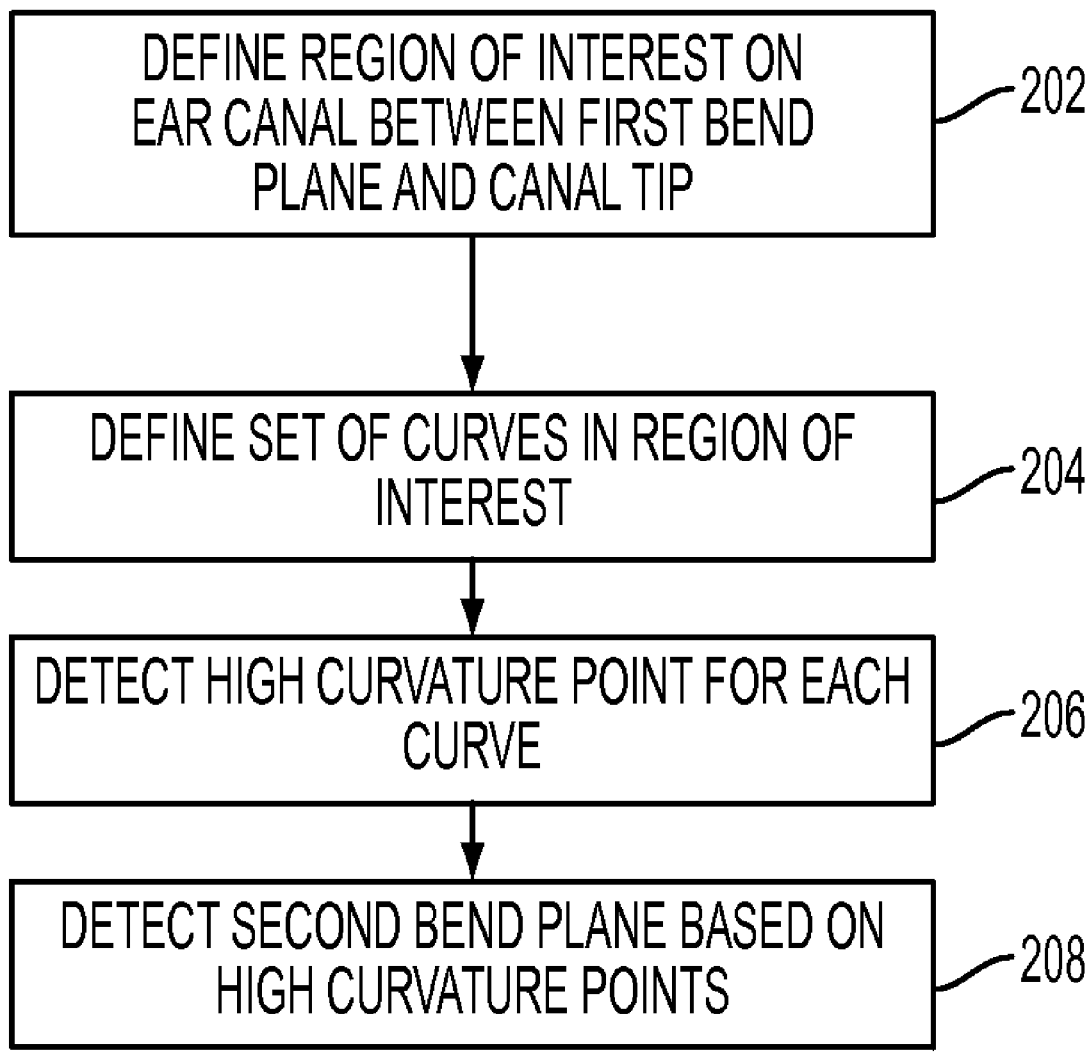
FIG. 2 illustrates a method for second bend plane detection for an ear canal surface according to an embodiment of the present invention.

FIG. 2 illustrates a method for second bend plane detection for an ear canal surface according to an embodiment of the present invention. The method of FIG. 2 transforms digital data of a 3D undetailed ear impression representing the shape of an ear to detect a location of the second bend plane of the ear canal. For example, given a mesh M representing a surface, the method of FIG. 2 detects a second bend plane S of the ear canal. The surface model (mesh) M can be generated from a 3D undetailed ear impression. A 3D undetailed ear impression is 3D data of an ear generated by a 3D scan of a patient's ear. The 3D undetailed ear impression resulting from a 3D scanner is typically a 3D point cloud representing the shape of the scanned ear. A computer system performing the steps of the method of FIG. 2 can load a scanned 3D point cloud, for example from a memory or storage of the computer system or from a computer readable medium. Once the 3D point cloud is loaded, it can be triangulated using surface reconstruction techniques to generate a surface M of the 3D undetailed ear impression.

Referring to FIG. 2, at step 202, a region of interest is defined on the ear canal between the first bend plane and the ear canal tip. The region of interest R defines a portion of the 3D undetailed ear impression (i.e., the surface mesh M) where the method searches for the second bend plane S. The region of interest R is bounded by two planes parallel to the first bend plane F, forming upper and lower boundaries. The region of interest R can be defined as follows:

$$R = \left\{ v \in V : \frac{1}{6}D < d_f(v) < \frac{5}{6}D \right\},$$

where V is all of the voxels in M, v is the voxels in R, $d_f$ denotes the distance to the first bend plane F (defined to be positive between F and the canal tip), and D denotes the distance between the first bend plane F and a plane parallel to F through the ear canal tip. Accordingly, the lower and upper boundary planes are parallel to F and are located at $$\frac{1}{6}D$$

and $$\frac{5}{6}D,$$

respectively. As illustrated in the 3D undetailed ear impression of FIG. 1, lower and upper boundary planes 108 and 110 define a region of interest between the first bed plane 104 and the ear canal tip 106.

Returning to FIG. 2, at step 204, a set of curves is defined on the ear canal surface in the region of interest. Cutting the 3D undetailed ear impression surface mesh M with the upper and lower boundary planes results in two contours. N corresponding samples are obtained on both the upper and lower contours by traversing both contours simultaneously according to some approximated discrete arc length parameterization. This results in a set of corresponding pairs of sample points on the upper and lower contours. Each pair of these samples points on the upper and lower contours, together with the mid point of a line connecting the centroids of the upper and lower contours, defines a vertical plane $P_i$. The 3D undetailed ear impression surface mesh M is cut by each vertical plane $P_i$ to extract the points M between the corresponding sample points on the upper and lower contours. Accordingly, each vertical plane $P_i$ cuts M in order to define curves that run vertically on M. This results in a set of vertical curves between the lower and upper boundary planes on the ear canal surface. Referring to the 3D undetailed ear impression of FIG. 1, curves 112, 114, and 116 are defined between the lower boundary plane 108 and the upper boundary plane 110 on the ear canal surface.

Returning to FIG. 2, at step 206, a high curvature point is detected for each of the curves defined on the ear canal surface. The set of curves defined in step 204 are used to detect bends in the region of interest R. Accordingly, a set of high curvature points is detected by detecting a high curvature point for each curve in the set of curves. Unfortunately, the discrete contours resulting from cutting the mesh M with the vertical planes $P_i$ may be too noisy for direct curvature estimation. For this reason, a cubic B-spline curve can be fit to each cut to generate a smooth curve, and the point on each smooth curve having the highest value is detected. In order to detect the highest curvature point for each curve, each curve can be sampled numerous times. The sampling of each curve may exclude points at either end of each curve, and may slightly shrink the region of interest. The detected set of high curvature points can be denoted as $Q = \{q_i\}$ where $q_i$ is the high curvature point for the $i^{th}$ curve. Referring to the ear canal surface of FIG. 1, high curvature points 118, 120, and 122 are detected for curves 112, 114, and 116, respectively.

Figure 3:
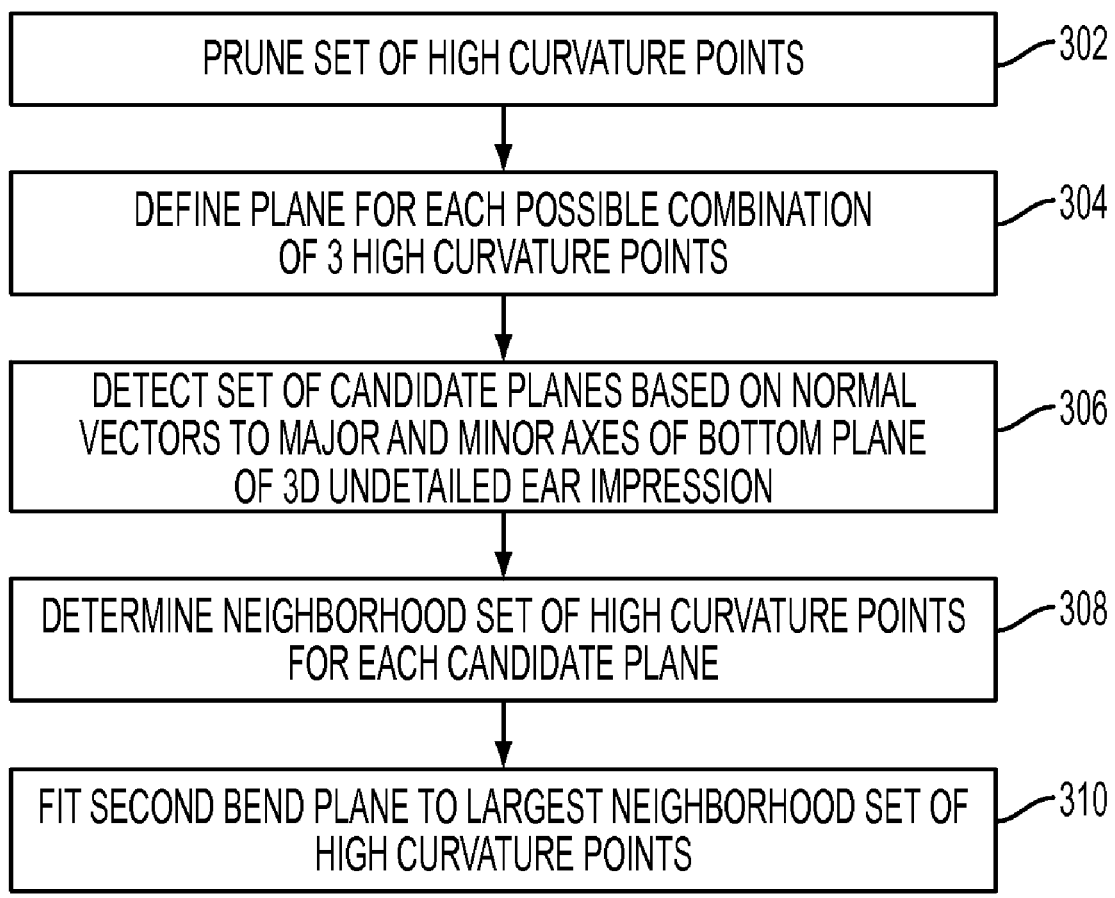
FIG. 3 illustrates a method of detecting the second bend plane using a set of high curvature points according to an embodiment of the present invention.

Returning to FIG. 2, at step 208, the second bend plane is detected based on the detected high curvature points. A plane representing the second bend plane is fit to the high curvature points of the curves defined in the region of interest. FIG. 3 illustrates a method of detecting the second bend plane using a set of high curvature points according to an embodiment of the present invention. Accordingly, step 208 of the method of FIG. 2 can be implemented using the method of FIG. 3. Referring to FIG. 3, at step 302, the set of high curvature points is pruned. In order to increase robustness of the subsequent plane fitting, all high curvature points $q_i$ with curvature below a threshold $t_C$ are removed. The threshold $t_C$ is the minimal value for a high curvature point of a vertical line on the canal to contribute to the second bend plane detection. The pruning of the high curvature points below $t_C$ results in a remaining set Q' of high curvature points.

At step 304, a plane is defined for each possible combination of three high curvature points in the remaining set of high curvature points. For all possible three point combinations in the remaining set Q' of high curvature points, each three point combination defines a plane $W = (n_W, d_W)$. At step 306, a set of candidate planes are detected based on the normal vectors to the major and minor axes of the bottom plane of the 3D undetailed ear impression (i.e., the shell mesh M). Examining the bottom plane of the 3D undetailed ear impression, it can be seen that its cut contour can be approximated by an ellipse bearing a major and minor axis. In order for a plane W to be further considered as a candidate plane, its normal vector $n_W$ must have an angle greater than or equal to a threshold $t_+$ with the major axis of the bottom plane of the 3D undetailed ear impression (shell mesh M), and an angle greater than or equal to a threshold $t_-$ with the minor axis of the bottom plane of the 3D undetailed ear impression (shell mesh M). This criteria is used to determine candidate planes, as the angle of the normal with respect to the major and minor axes of the bottom plane controls the slope of the plane W. Since a deviation of the normal in the direction of the minor axis is more acceptable that a deviation in the direction of the major axis, the separate thresholds $t_+$ and $t_-$ are used for the major and minor axes, respectively.

At step 308, a neighborhood set of high curvature points is determined for each candidate plane. For each plane W detected as a candidate plane, a neighborhood set N of high curvature points is determined as the high curvature points in Q' that are within a distance threshold $t_d$ to W. The distance threshold $t_d$ defines distance from a plane defined by three seed points, and all high curvature points within this distance are used for fitting the second bend plane. At step 310, the second bend plane is fit to the largest neighborhood set of high curvature points for the candidate planes. For each plane W detected as a candidate plane, the number of points in the corresponding neighborhood set N is counted. The largest neighborhood set N defines the point set that is used to define the second bend plane. The second bend plane is fit to the points in the largest neighborhood set N, for example using a least squares fit, resulting in a final second bend plane result.

Figure 4:
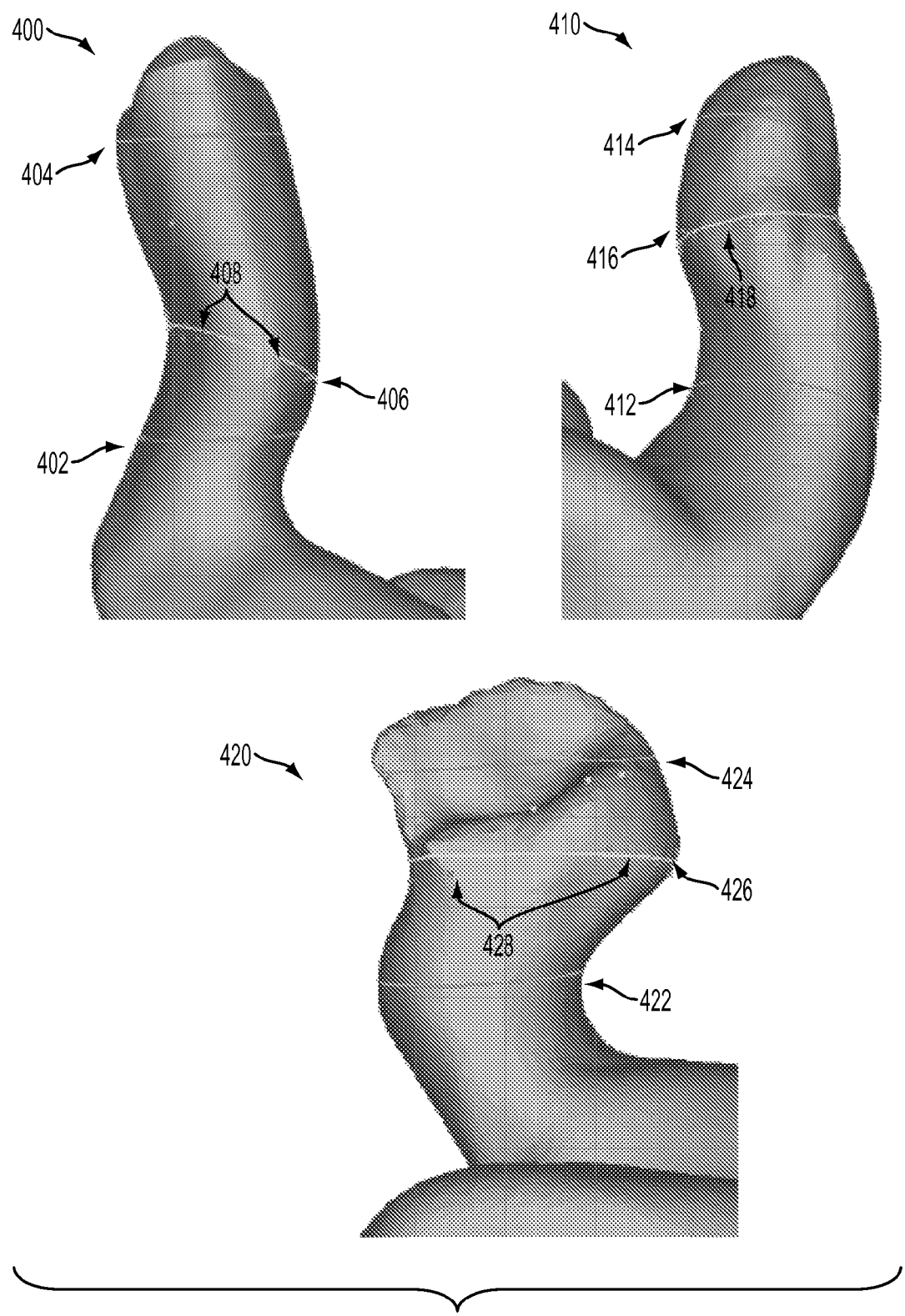
FIG. 4 illustrates exemplary second bend plane detection results using the methods of FIGS. 2 and 3.

FIG. 4 illustrates exemplary second bend plane detection results using the methods of FIGS. 2 and 3. As illustrated in FIG. 4, second bend plane detection results can be visually displayed in an image representing the ear canal surface. Referring to FIG. 4 images 400, 410, and 420 show exemplary ear canal portions of 3D undetailed ear impression surface meshes. For each of the 3D undetailed ear impression surface meshes 400, 410, and 420, a lower boundary contour 402, 412, and 422 and an upper boundary contour 404, 414, and 424 defining the region of interest is shown. For each of the 3D undetailed ear impression surface meshes 400, 410, and 420, the second bend plane result 406, 416, and 426 is shown as a contour resulting from cutting the second bend plane with the respective ear canal surface mesh 400, 410, and 420. The high curvature points 408, 418, and 428 in the neighborhood set used to define the respective second bend planes 406, 416, and 426 are also shown.

Once the second bend plane is detected for ear canal data of a patient, the second bend plane can be used as a feature in automatic hearing aid manufacturing. Accordingly, the automatic second bend plane detection method can be used in automatically generating/manufacturing hearing aids that are customized to a patient's ear.

Figure 5:
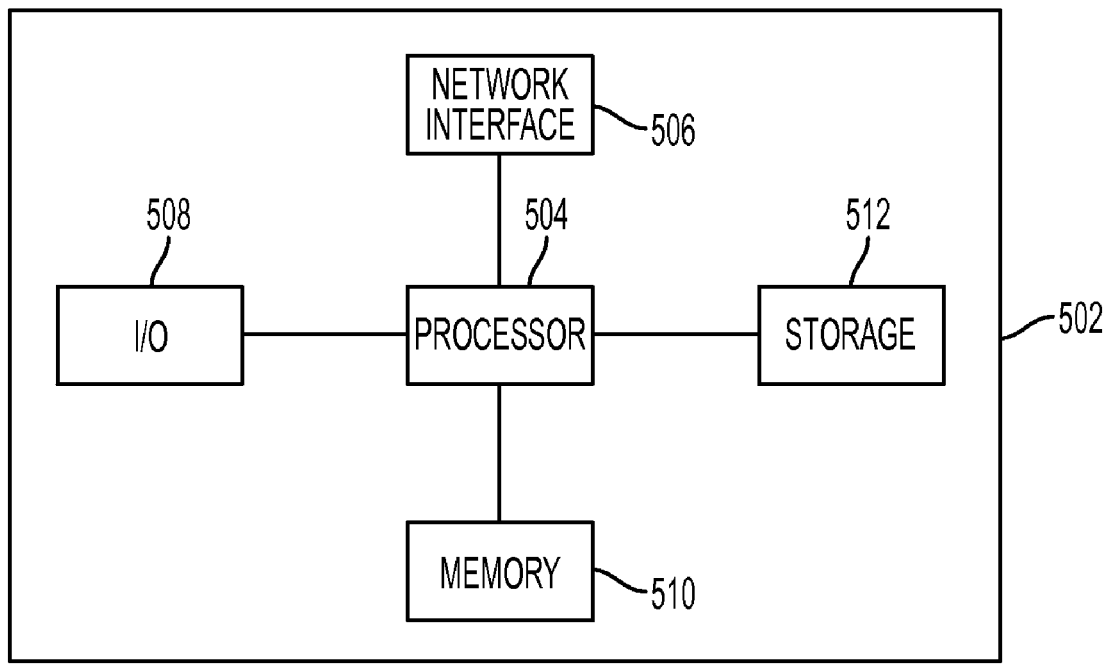
FIG. 5 is a high level block diagram of a computer capable of implementing the present invention.

The above described methods for detection of the second bend plane in a 3D undetailed ear impression can be implemented on a computer using well-known computer processors, memory units, storage devices, computer software, and other components. A high level block diagram of such a computer is illustrated in FIG. 5. Computer 502 contains a processor 504 which controls the overall operation of the computer 502 by executing computer program instructions which define such operation. The computer program instructions may be stored in a storage device 512 (e.g., magnetic disk) and loaded into memory 510 when execution of the computer program instructions is desired. Thus, the method steps of the methods of FIGS. 2 and 3, can be defined by the computer program instructions stored in the memory 510 and/or storage 512 and controlled by the processor 504 executing the computer program instructions. The computer 502 also includes one or more network interfaces 506 for communicating with other devices via a network. The computer 502 also includes other input/output devices 508 that enable user interaction with the computer 502 (e.g., display, keyboard, mouse, speakers, buttons, etc.) One skilled in the art will recognize that an implementation of an actual computer could contain other components as well, and that FIG. 5 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention.

Those skilled in the art could implement various other feature combinations without departing from the scope and spirit of the invention.

The invention claimed is:

1. A method for second bend plane detection of an ear canal surface, comprising:
    determining lower and upper boundary planes defining a region of interest on an ear canal portion of a 3D undetailed ear impression;
    defining a set of curves in the region of interest running from the lower boundary plane to the upper boundary plane of the region of interest;
    detecting a set of high curvature points for the set of curves; and
    detecting a second bend plane based on the set of high curvature points.

2. The method of claim 1, wherein said step of determining lower and upper boundary planes defining a region of interest on an ear canal portion of a 3D undetailed ear impression comprises:
    determining the lower and upper boundary planes between a first bend plane of the ear canal and an ear canal tip.

3. The method of claim 2, wherein D a distance between the first bend plane and a plane parallel to the first bend plane through the ear canal tip, the lower boundary plane is parallel to the first bend plane and located ⅙ D from the first bend plane, and the upper boundary plane is parallel to the first bend plane and located ⅚ D from the first bend plane.

4. The method of claim 1, wherein said step of defining a set of curves in the region of interest running from the lower boundary plane to the upper boundary plane of the region of interest comprises:
    cutting the 3D undetailed ear impression by the upper and lower boundary planes resulting in upper and lower contours on the 3D undetailed ear impression;
    generating a plurality of corresponding sample points on the upper and lower contours by traversing the upper and lower contours simultaneously according to a discrete arc length parameterization;
    defining a vertical plane based each pair of corresponding sample points on the upper and lower contours and a mid point of a connecting line of centroids of the upper and lower contours; and
    cutting the 3D undetailed ear impression with each vertical plane to generate a curve on the 3D undetailed ear impression between each pair of corresponding sample points of the upper and lower contours.

5. The method of claim 1, wherein said step of detecting a set of high curvature points for the set of curves comprises:
    detecting a point having a highest curvature for each curve in the set of curves.

6. The method of claim 5, wherein said step of detecting a point having a highest curvature for each curve in the set of curves comprises:
    generating a smooth curve corresponding to each curve in the set of curves by fitting a cubic B-spline curve to each curve; and
    sampling each smooth curve to determine a point having the highest curvature for each smooth curve.

7. The method of claim 1, wherein said step of detecting a second bend plane based on the set of high curvature points comprises:
    defining a plane for each possible combination of three high curvature points;
    detecting a set of candidate planes based on normal vectors between each plane and major and minor axes of a bottom plane of the 3D undetailed ear impression;

determining a neighborhood set of high curvature points for each candidate plane;

generating the second bend plane by fitting the second bend plane to a largest neighborhood set of high curvature points.

8. The method of claim 7, wherein said step of detecting a second bend plane based on the set of high curvature points further comprises:

pruning the set of high curvature points by removing all high curvature points with curvature below a threshold from the set of high curvature points prior to said step of defining a plane for each possible combination of high curvature points.

9. The method of claim 7, wherein said step of detecting a set of candidate planes based on normal vectors between each plane and major and minor axes of a bottom plane of the 3D undetailed ear impression comprises:

determining that a plane is a candidate plane if the normal vector between the plane and the major axis of the bottom plane is greater than or equal to a first threshold and the normal vector between the plane and the minor axis of the bottom plane is greater than or equal to a second threshold.

10. The method of claim 7, wherein said step of determining a neighborhood set of high curvature points for each candidate plane comprises:

for each candidate plane, defining the neighborhood set of high curvature points as the high curvature points within a certain distance of the candidate plane.

11. The method of claim 7, wherein said step of generating the second bend plane by fitting the second bend plane to a largest neighborhood set of high curvature points comprises:

fitting the second bend plane to the largest neighborhood set of high curvature points using a least squares fit.

12. An apparatus for second bend plane detection of an ear canal surface, comprising:

means for determining lower and upper boundary planes defining a region of interest on an ear canal portion of a 3D undetailed ear impression;

means for defining a set of curves in the region of interest running from the lower boundary plane to the upper boundary plane of the region of interest;

means for detecting a set of high curvature points for the set of curves; and means for detecting a second bend plane based on the set of high curvature points.

13. The apparatus of claim 12, wherein said means for determining lower and upper boundary planes defining a region of interest on an ear canal portion of a 3D undetailed ear impression comprises:

means for determining the lower and upper boundary planes between a first bend plane of the ear canal and an ear canal tip.

14. The apparatus of claim 12, wherein said means for defining a set of curves in the region of interest running from the lower boundary plane to the upper boundary plane of the region of interest comprises:

means for cutting the 3D undetailed ear impression by the upper and lower boundary planes resulting in upper and lower contours on the 3D undetailed ear impression;

means for generating a plurality of corresponding sample points on the upper and lower contours by traversing the upper and lower contours simultaneously according to a discrete arc length parameterization;

means for defining a vertical plane based each pair of corresponding sample points on the upper and lower contours and a mid point of a connecting line of centroids of the upper and lower contours; and means for cutting the 3D undetailed ear impression with each vertical plane to generate a curve on the 3D undetailed ear impression between each pair of corresponding sample points of the upper and lower contours.

15. The apparatus of claim 12, wherein said means for detecting a set of high curvature points for the set of curves comprises:

means for detecting a point having a highest curvature for each curve in the set of curves.

16. The apparatus of claim 12, wherein said means for detecting a second bend plane based on the set of high curvature points comprises:

means for defining a plane for each possible combination of three high curvature points;

means for detecting a set of candidate planes based on normal vectors between each plane and major and minor axes of a bottom plane of the 3D undetailed ear impression;

means for determining a neighborhood set of high curvature points for each candidate plane;

means for generating the second bend plane by fitting the second bend plane to a largest neighborhood set of high curvature points.

17. The apparatus of claim 16, wherein said means for detecting a set of candidate planes based on normal vectors between each plane and major and minor axes of a bottom plane of the 3D undetailed ear impression comprises:

means for determining that a plane is a candidate plane if the normal vector between the plane and the major axis of the bottom plane is greater than or equal to a first threshold and the normal vector between the plane and the minor axis of the bottom plane is greater than or equal to a second threshold.

18. The apparatus of claim 16, wherein said means for determining a neighborhood set of high curvature points for each candidate plane comprises:

means for defining the neighborhood set of high curvature points for each candidate plane as the high curvature points within a certain distance of the candidate plane.

19. The apparatus of claim 16, wherein said means for generating the second bend plane by fitting the second bend plane to a largest neighborhood set of high curvature points comprises:

means for fitting the second bend plane to the largest neighborhood set of high curvature points using a least squares fit.

20. A computer readable medium encoded with computer executable instructions for second bend plane detection of an ear canal surface, the computer executable instructions defining steps comprising:

determining lower and upper boundary planes defining a region of interest on an ear canal portion of a 3D undetailed ear impression;

defining a set of curves in the region of interest running from the lower boundary plane to the upper boundary plane of the region of interest;

detecting a set of high curvature points for the set of curves; and detecting a second bend plane based on the set of high curvature points.

21. The computer readable medium of claim 20, wherein the computer executable instructions defining the step of determining lower and upper boundary planes defining a region of interest on an ear canal portion of a 3D undetailed ear impression comprise computer executable instructions defining the step of:

determining the lower and upper boundary planes between a first bend plane of the ear canal and an ear canal tip.

22. The computer readable medium of claim 20, wherein the computer executable instructions defining the step of defining a set of curves in the region of interest running from the lower boundary plane to the upper boundary plane of the region of interest comprise computer executable instructions defining the steps of:

cutting the 3D undetailed ear impression by the upper and lower boundary planes resulting in upper and lower contours on the 3D undetailed ear impression;

generating a plurality of corresponding sample points on the upper and lower contours by traversing the upper and lower contours simultaneously according to a discrete arc length parameterization;

defining a vertical plane based each pair of corresponding sample points on the upper and lower contours and a mid point of a connecting line of centroids of the upper and lower contours; and cutting the 3D undetailed ear impression with each vertical plane to generate a curve on the 3D undetailed ear impression between each pair of corresponding sample points of the upper and lower contours.

23. The computer readable medium of claim 20, wherein the computer executable instructions defining the step of detecting a set of high curvature points for the set of curves comprise computer executable instructions defining the step of:

detecting a point having a highest curvature for each curve in the set of curves.

24. The computer readable medium of claim 20, wherein the computer executable instructions defining the step of detecting a second bend plane based on the set of high curvature points comprise computer executable instructions defining the steps of:

defining a plane for each possible combination of three high curvature points;

detecting a set of candidate planes based on normal vectors between each plane and major and minor axes of a bottom plane of the 3D undetailed ear impression;

determining a neighborhood set of high curvature points for each candidate plane;

generating the second bend plane by fitting the second bend plane to a largest neighborhood set of high curvature points.

25. The computer readable medium of claim 24, wherein the computer executable instructions defining the step of detecting a second bend plane based on the set of high curvature points further comprise computer executable instructions defining the step of:

pruning the set of high curvature points by removing all high curvature points with curvature below a threshold from the set of high curvature points prior to said step of defining a plane for each possible combination of high curvature points.

26. The computer readable medium of claim 24, wherein said the computer executable instructions defining the step of detecting a set of candidate planes based on normal vectors between each plane and major and minor axes of a bottom plane of the 3D undetailed ear impression comprise computer executable instructions defining the step of:

determining that a plane is a candidate plane if the normal vector between the plane and the major axis of the bottom plane is greater than or equal to a first threshold and the normal vector between the plane and the minor axis of the bottom plane is greater than or equal to a second threshold.

27. The computer readable medium of claim 24, wherein the computer executable instructions defining the step of determining a neighborhood set of high curvature points for each candidate plane comprise computer executable instructions defining the step of:

for each candidate plane, defining the neighborhood set of high curvature points as the high curvature points within a certain distance of the candidate plane.

28. The computer readable medium of claim 24, wherein the computer executable instructions defining the step of generating the second bend plane by fitting the second bend plane to a largest neighborhood set of high curvature points comprise computer executable instructions defining the step of:

fitting the second bend plane to the largest neighborhood set of high curvature points using a least squares fit.

* * * * *